US009137914B2

(12) United States Patent
Takao

(10) Patent No.: US 9,137,914 B2
(45) Date of Patent: Sep. 15, 2015

(54) ELECTRONIC APPARATUS, SUPPORT DEVICE, AND ATTACHMENT STRUCTURE

(71) Applicant: Mitsuyoshi Takao, Hidaka (JP)

(72) Inventor: Mitsuyoshi Takao, Hidaka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 347 days.

(21) Appl. No.: 13/682,315

(22) Filed: Nov. 20, 2012

(65) Prior Publication Data
US 2013/0223015 A1    Aug. 29, 2013

(30) Foreign Application Priority Data

Feb. 27, 2012    (JP) ................................. 2012-040072

(51) Int. Cl.
*H05K 5/03*    (2006.01)
*F16B 5/00*    (2006.01)
*H05K 5/02*    (2006.01)

(52) U.S. Cl.
CPC ............... *H05K 5/03* (2013.01); *F16B 5/0084* (2013.01); *H05K 5/02* (2013.01); *H05K 5/0208* (2013.01); *H05K 5/0234* (2013.01); *Y10T 403/70* (2015.01)

(58) Field of Classification Search
CPC ........................................................ H05K 5/03
USPC ................ 248/346.01, 551; 361/428, 679.02; 348/836, 825; 411/5, 544, 545; 403/345
See application file for complete search history.

(56) References Cited

U.S. PATENT DOCUMENTS

| | | | | |
|---|---|---|---|---|
| 2,116,690 A * | 5/1938 | Woodings | ...................... | 411/544 |
| 2,130,546 A * | 9/1938 | Hovey | ............................ | 403/387 |
| 5,687,453 A * | 11/1997 | Megregian et al. | ............. | 16/221 |
| 6,705,813 B2 * | 3/2004 | Schwab | ......................... | 411/526 |
| 6,760,231 B2 * | 7/2004 | Hung et al. | .................... | 361/758 |
| 8,278,551 B2 * | 10/2012 | Fan | ................................. | 174/50 |
| 8,827,588 B2 * | 9/2014 | Inaba et al. | ................ | 403/408.1 |
| 2009/0196686 A1 * | 8/2009 | Palm | ............................. | 403/388 |
| 2012/0212685 A1 * | 8/2012 | Tanaka | .......................... | 348/843 |

FOREIGN PATENT DOCUMENTS

| | | |
|---|---|---|
| JP | H 01-21909 | 6/1989 |
| JP | 05-090771 | 4/1993 |
| JP | 05-326041 | 12/1993 |
| JP | H 06-71266 | 10/1994 |

(Continued)

OTHER PUBLICATIONS

Japanese Patent Application No. 2012-040072, First Office Action, mailed Jan. 15, 2013, (with English Translation).

(Continued)

*Primary Examiner* — Jonathan Liu
*Assistant Examiner* — Chiedu Chibogu
(74) *Attorney, Agent, or Firm* — William W. Schaal; Rutan & Tucker, LLP

(57) ABSTRACT

According to one embodiment, the electronic device of this embodiment includes a module, a first plate which has a first surface and a second surface, the first plate supporting the module, a cover which includes an attaching surface that is attached to the first plate, and an engaging part that includes a tip part, a second plate which is attached to the first plate from a side of the second surface and fill a space between the second surface and the tip part, the second plate being engaged with the engaging part and fixing the cover onto the first plate, and a fixing member which fixes the second plate onto the first plate.

9 Claims, 10 Drawing Sheets

(56) References Cited

FOREIGN PATENT DOCUMENTS

| | | |
|---|---|---|
| JP | H 07-111917 | 5/1995 |
| JP | 2001-282130 | 10/2001 |
| JP | 2003-184250 | 7/2003 |

OTHER PUBLICATIONS

Japanese Patent Application No. 2012-040072, Decision of Rejection, mailed May 28, 2013, (with English Translation).

* cited by examiner

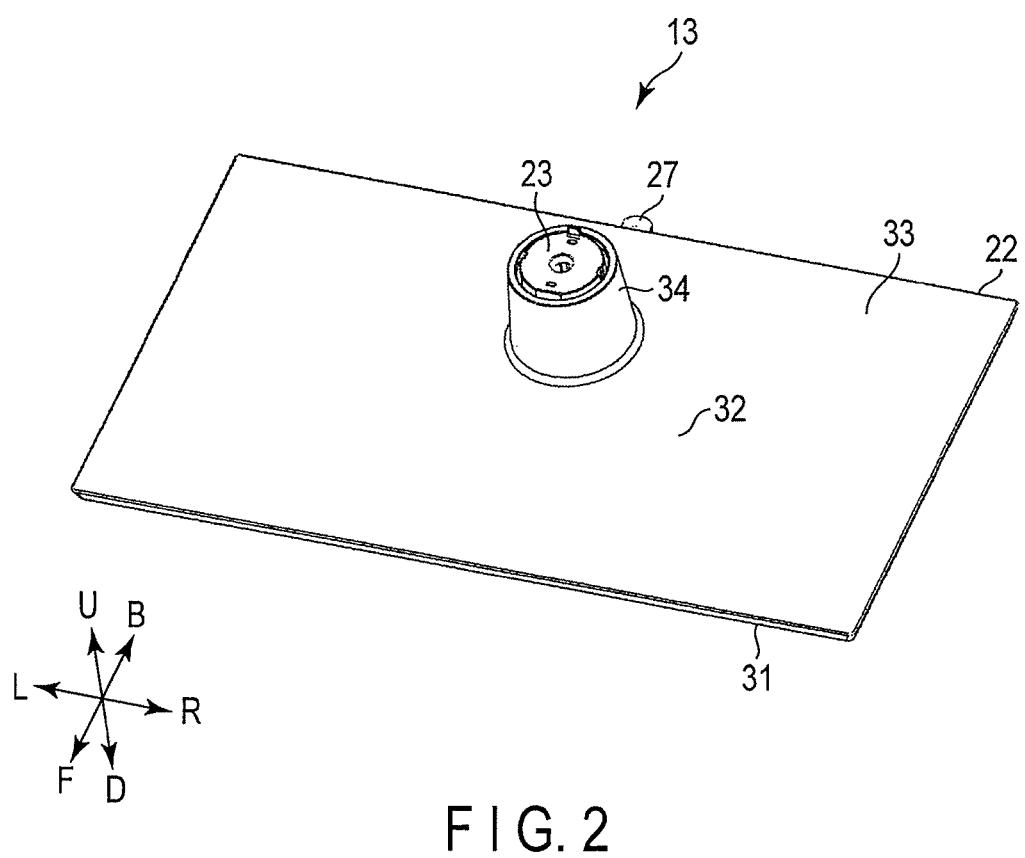
F I G. 2

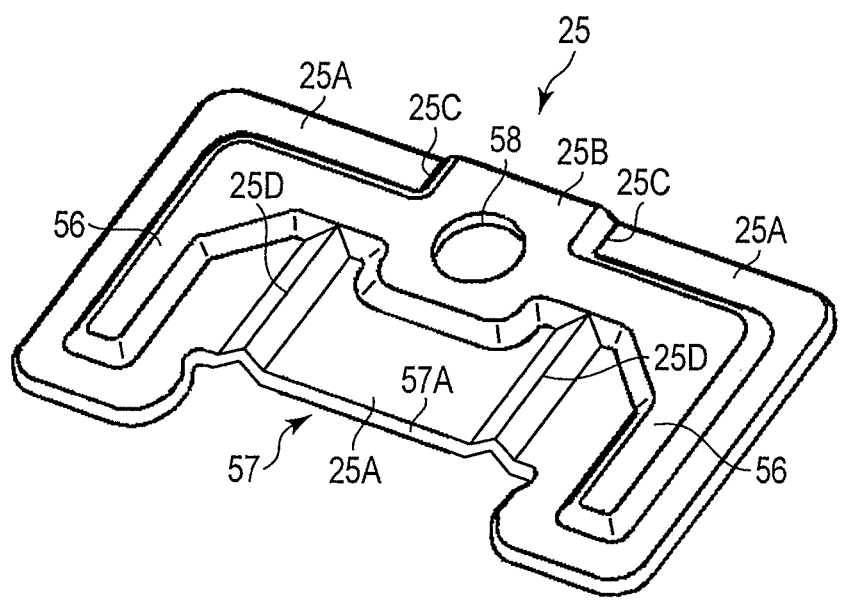
F I G. 12

ELECTRONIC APPARATUS, SUPPORT DEVICE, AND ATTACHMENT STRUCTURE

CROSS-REFERENCE TO RELATED APPLICATIONS

This application is based upon and claims the benefit of priority from Japanese Patent Application No. 2012-040072, filed Feb. 27, 2012, the entire contents of which are incorporated herein by reference.

FIELD

Embodiments described herein relate generally to an electronic apparatus which includes a display screen.

BACKGROUND

A stand of a display apparatus is disclosed.

A support device of a display apparatus is a part which is easily viewed by the user, and there are demands for improvement of this part.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 2 is an exemplary perspective view of a support module of the display apparatus illustrated in FIG. 1.

FIG. 12 is an exemplary perspective view of a second plate of the display apparatus being an example of an electronic apparatus according to a second embodiment.

DETAILED DESCRIPTION

Various embodiments will be described hereinafter with reference to the accompanying drawings.

In general, according to one embodiment, the electronic device of this embodiment includes a module, a first plate which has a first surface and a second surface, the first plate supporting the module, a cover which includes an attaching surface that is attached to the first plate, and an engaging part that includes a tip part, a second plate which is attached to the first plate from a side of the second surface and fill a space between the second surface and the tip part, the second plate being engaged with the engaging part and fixing the cover onto the first plate, and a fixing member which fixes the second plate onto the first plate.

Figure 1:
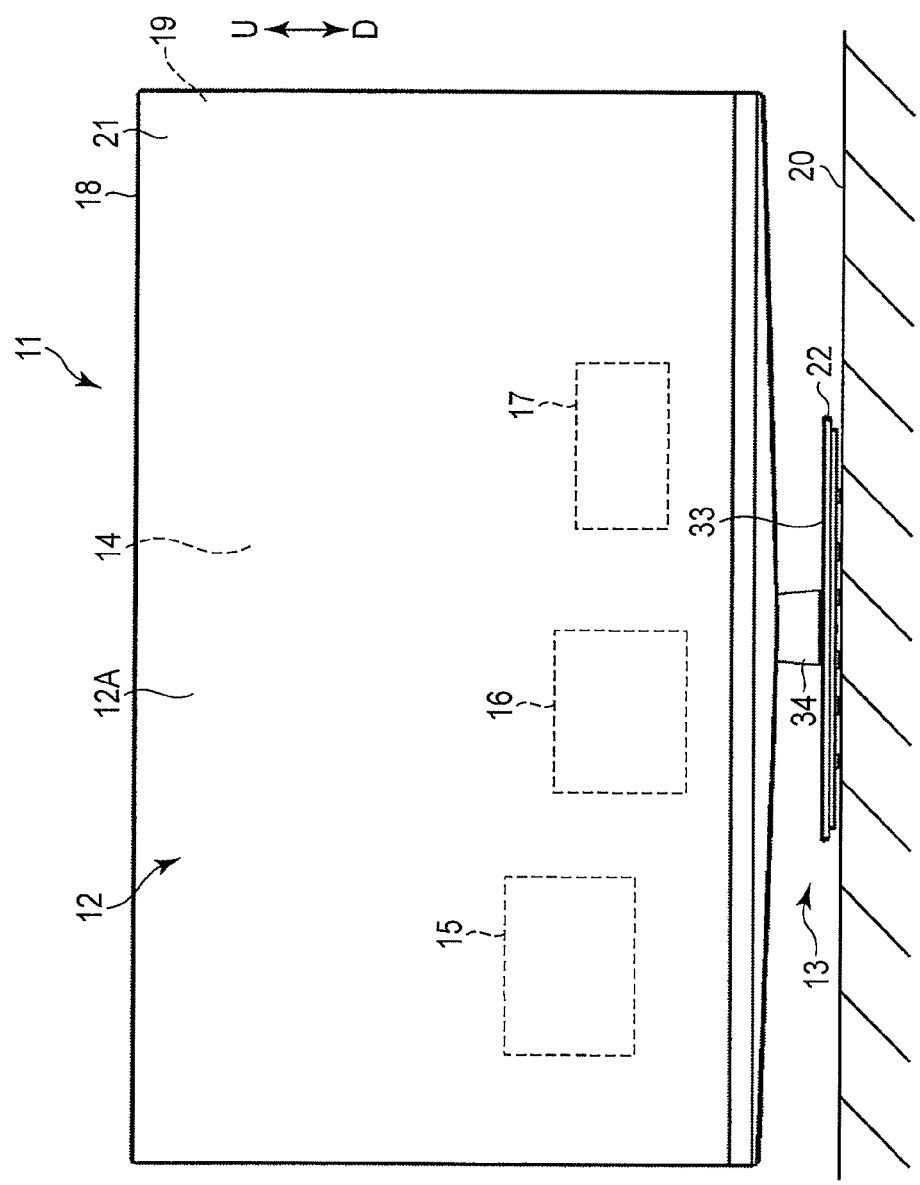
FIG. 1 is an exemplary front view of a display apparatus which is an example of an electronic apparatus according to a first embodiment.

A first embodiment of a display apparatus will be explained hereinafter with reference to FIG. 1 to FIG. 11. As illustrated in FIG. 1, a display apparatus (television) which is an example of an electronic apparatus according to the present embodiment is a display apparatus which has a generally rectangular external appearance. In the following embodiment, a front side (that is, user side) is defined as front direction F, a depth side as viewed from the user is defined as a back direction B, a left side as viewed from the user is defined as left direction L, a right side as viewed from the user is defined as right direction R, an upper side as viewed from the user is defined as upper direction U, and a down side as viewed from the user is defined as down direction D.

As illustrated in FIG. 1, the display apparatus 11 comprises a display module 12 which is provided with a display screen 12A, and a support module 13 (leg module, stand) which supports the display module 12. The display module 12 includes a flat display panel 14 which forms the display screen 12A, a tuner substrate 15, a system substrate 16 which controls the modules in the display apparatus 11, a power supply circuit substrate 17, and a housing 18 (case) which encloses the display panel 14, the tuner substrate 15, the system substrate 16, and the power supply circuit substrate 17. The housing 18 includes a transparent front cover 21 which covers the front of the display panel 14, and a back cover 19 which covers the rear of the display panel 14. The display panel 14 is formed of, for example, a liquid crystal display panel, or may be a display panel of another type, such as a plasma display panel, an organic EL panel, a plastic display panel, and a sheet display panel. The display module 12 is an example of a module.

Figure 3:
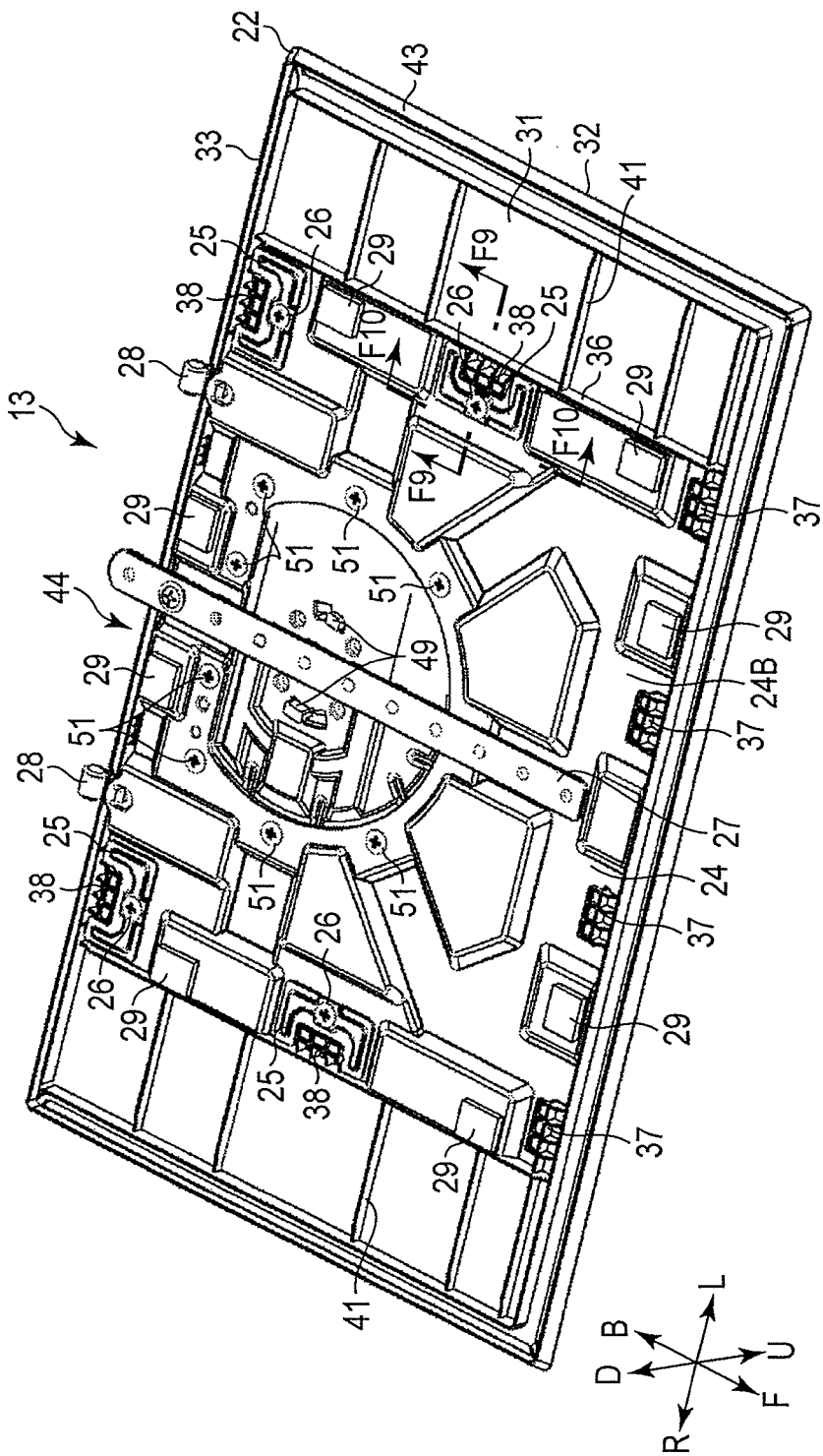
FIG. 3 is an exemplary perspective view of the support module illustrated in FIG. 2, as viewed from below.

As illustrated in FIG. 2 and FIG. 3, the support module 13 includes a first plate 24 which supports the display module 12 through a swivel part 23 described below, a cover 22 which is formed as one unitary piece by a synthetic resin material and attached to the first plate 24 by an attaching part 44, second plates 25 configured to fix the cover 22 onto the first plate 24, fixing members 26 configured to fix the second plates 25 onto the first plate 24, and a band 27 and string-hole rings 28 which are attached to the first plate 24 and prevent the display apparatus 11 from falling down. The fixing members 26 are formed of, for example, screws, or may be rivets.

The cover 22 includes a flat-plate part 33 which includes a lower bottom surface 31 that is opposed to a table or the like and an external appearance surface 32 that is located on a side (upper side) opposite to the bottom surface 31, and a cylinder part 34 which has a cylindrical shape and extends from the external appearance surface 32 of the flat-plate part 33 in a direction perpendicular to a direction in which the flat-plate part 33 extends. A swivel part 23 which supports the display module 12 such that the display module 12 is rotatable in a horizontal direction (direction which runs along a placing surface 20 (see FIG. 1) such as a table) is disposed inside the cylinder part 34. The swivel part 23 is fixed onto a subplate 48 of the first plate 24 described below.

Figure 5:
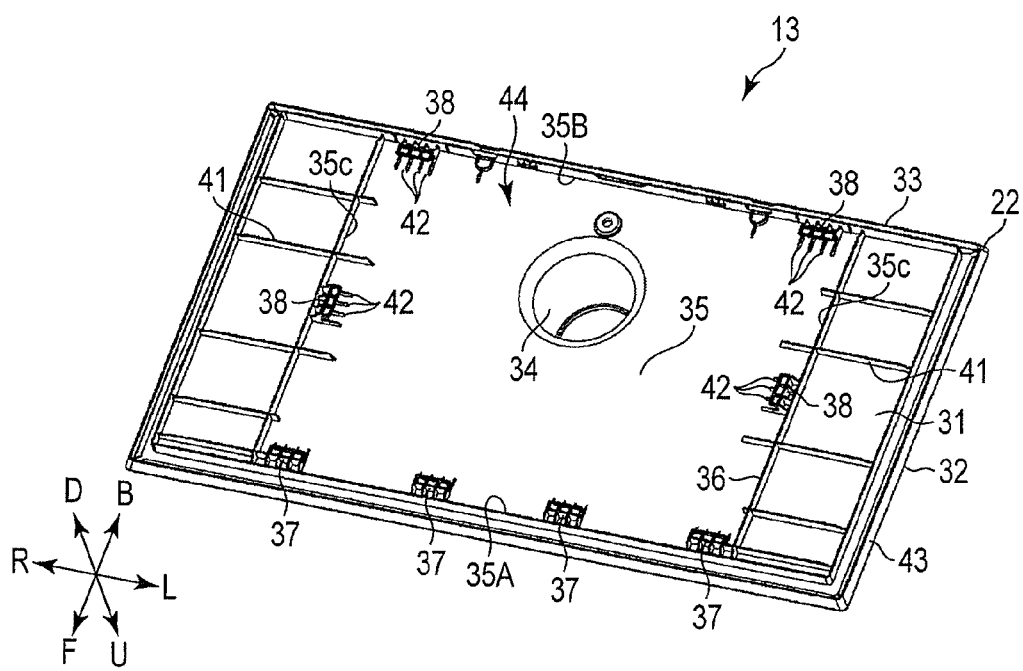
FIG. 5 is an exemplary perspective view of a cover of the support module illustrated in FIG. 2, as viewed from below.

As illustrated in FIG. 3 and FIG. 5, the cover 22 (flat-plate part 33) includes a square attaching surface 35 which is disposed in a part of the bottom surface 31 in almost flat manner, a frame part 36 which surrounds the attaching surface 35 and rises in a direction perpendicular to the attaching surface 35, a plurality of first engaging parts 37 and a plurality of second engaging parts 38 which are provided inside the frame part 36 and project from the attaching surface 35, a reinforcing first rib 41 which is provided in a lattice shape and outside the frame part 36 in the bottom surface 31, a plurality of second ribs 42 which are provided inside the frame part 36 and close to the first engaging parts 37 and the second engaging parts 38, and a frame-shaped peripheral part 43 which is provided at an outer edge of the bottom surface 31. The attaching surface 35, the frame part 36, the first engaging parts 37 and the second engaging parts 38 form an attaching part 44 configured to attach the cover 22 to the first plate 24.

The first plate 24 can be attached to the attaching surface 35. In the present embodiment, since the attaching surface 35 is formed as flat as possible, it is prevented to generate sink marks or the like in the external appearance surface 32 (molded surface) which is located in the rear of the attaching surface 35 when the cover 22 (molded product) is finished.

The square attaching surface 35 includes a first side part 35A which is located in the front, a second side part 35B which is located in the rear, and a pair of third side parts 35C which are located on the right and left sides.

Figure 4:
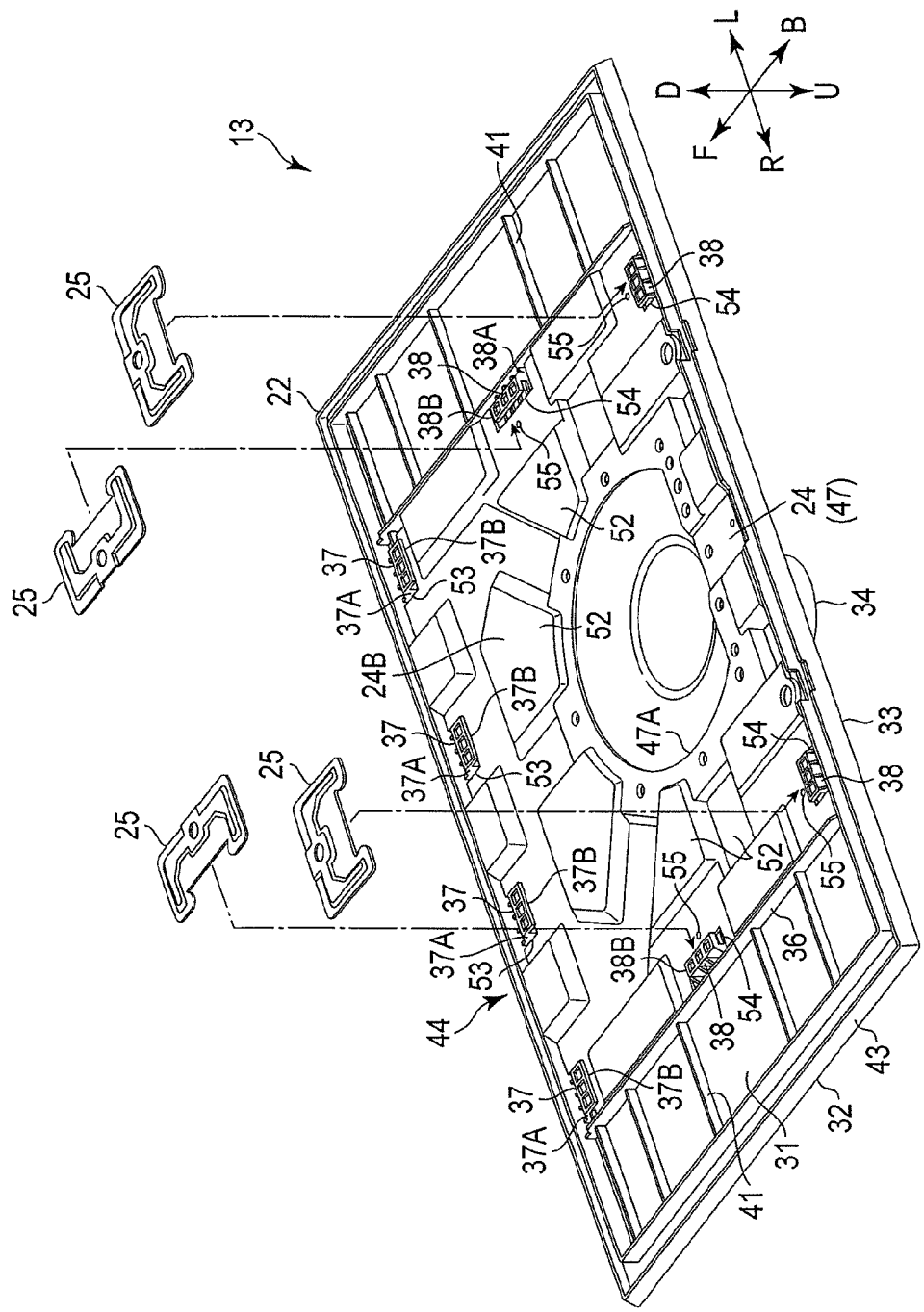
FIG. 4 is an exemplary perspective view illustrating operation of attaching second plates to second engaging parts of the support module illustrated in FIG. 1.
Figure 11:
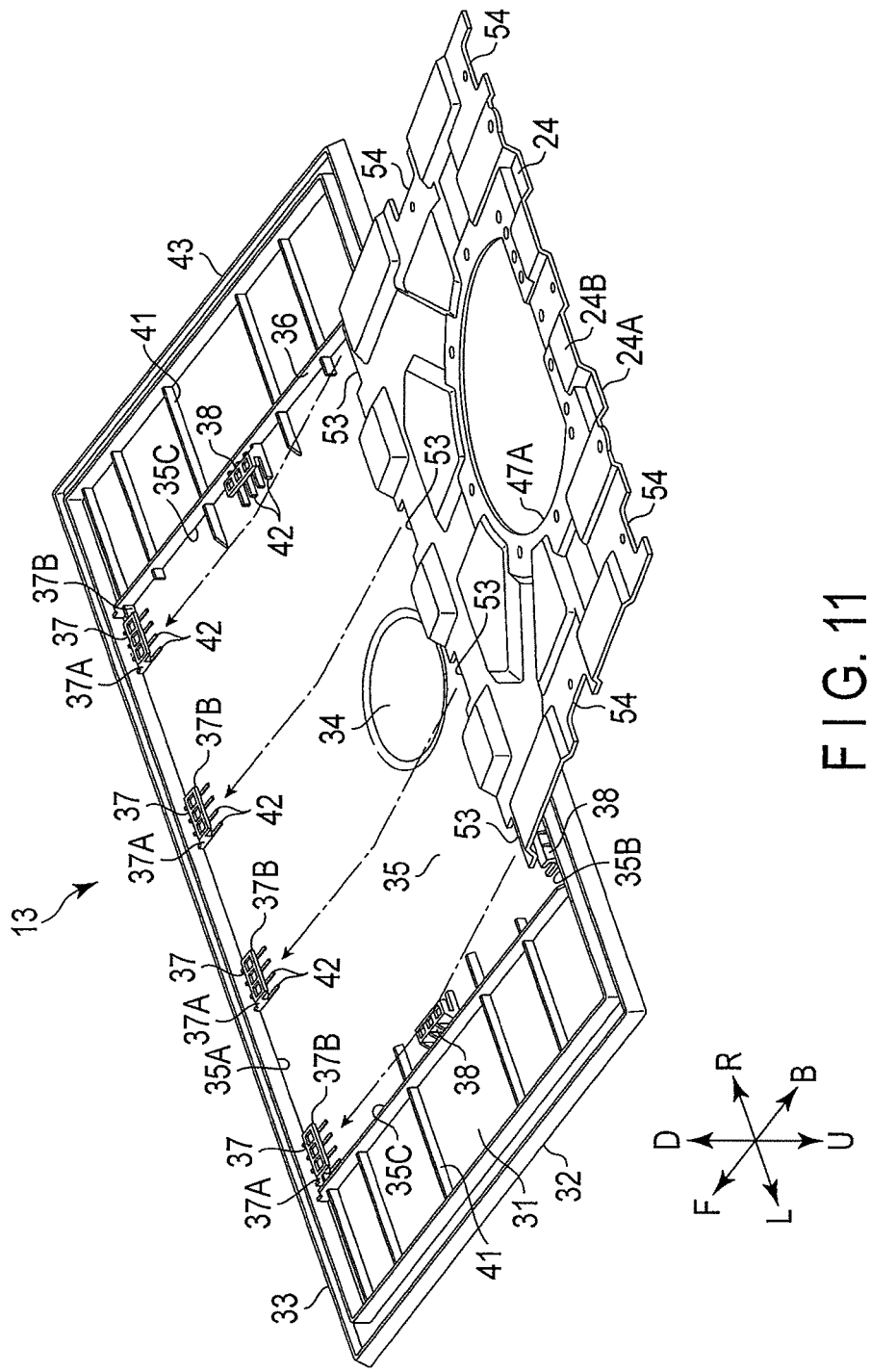
FIG. 11 is an exemplary perspective view of a step of assembling the support module illustrated in FIG. 2.

Four first engaging parts 37 are arranged side by side at regular intervals in the first side part 35A of the attaching surface 35. As illustrated in FIG. 4 and FIG. 11, each first engaging part 37 includes a first rising part 37A which rises from the attaching surface 35, and a first tip part 37B which is disposed on he side of the second surface 24B of the first plate 24 described below and extends from the first standing part 37A in a direction parallel with the first plate 24 (direction of going toward the center part of the first plate 24). Each first engaging part 37 has a cross section of an almost "L" shape.

As illustrated in FIG. 5, four second engaging parts 38 are formed. Specifically, two second engaging parts 38 are disposed in the second side part 35B, and one second engaging part 38 is disposed in each of the third side parts 35C. The two second engaging parts 38 disposed in the second side part 35B are located at both end parts of the second side part 35B and close to the respective third side parts 35C. The second engaging parts 38 located in the third side parts 35C are located in almost middle parts of the respective third side parts 35C in the depth direction. Arranging the second engaging parts 38 as described above sufficiently prevents the first plate 24 from falling out of the attaching surface 35, and can achieve reduction in the numbers of the second engaging parts 38 and the second plates 25, reduction in the number of steps in assembly, and reduction in the manufacturing cost.

Figure 6:
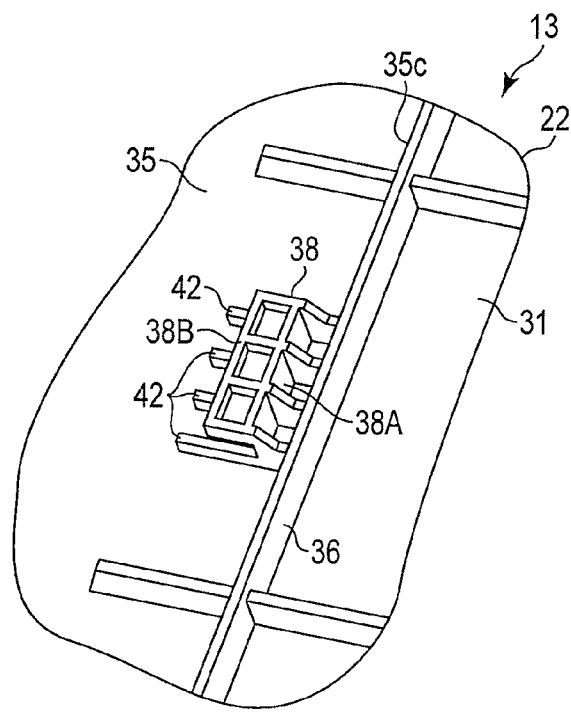
FIG. 6 is an exemplary enlarged perspective view of a part including the second engaging part of the cover illustrated in FIG. 5.

As illustrated in FIG. 4 and FIG. 6, each second engaging part 38 includes a second rising part 38A which rises from the attaching surface 35, and a second tip part 38B which is disposed on the side of a second surface 24B of the first plate 24 described below and extends from the second rising part 38A in a direction parallel with the first plate 24 (direction of going toward the center part of the first plate 24). Each second engaging part 38 has a cross section of an almost "L" shape.

Figure 9:
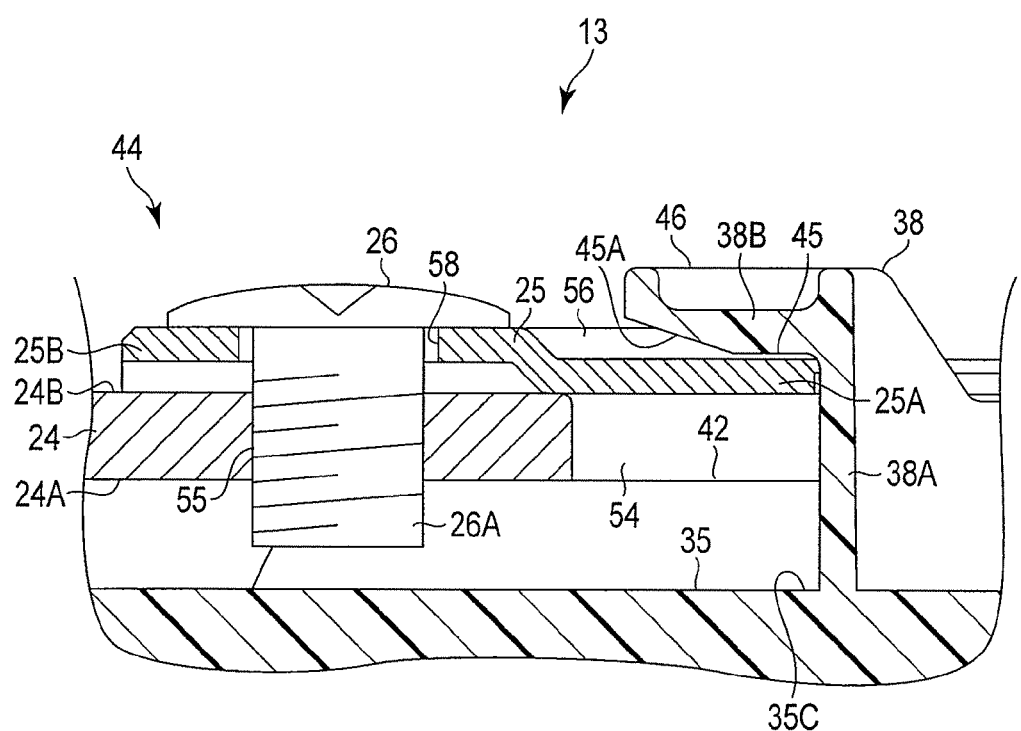
FIG. 9 is an exemplary cross-sectional view taken along line F9-F9 of FIG. 3.

As illustrated in FIG. 9, the second tip part 38B includes an internal surface 45 which faces the attaching surface 35, and an external surface 46 which is opposite to the internal surface 45 and exposed to the exterior. A distance between an end surface of the second rib 42 and the internal surface 45 is, for example, about 2.9 mm. Part of the internal surface 45 includes an inclined surface 45A. The inclined surface 45A is inclined such that the thickness of the second tip part 38B decreases toward the distal end thereof. The inclined surface 45A increases a space between the second surface 24B of the first plate 24 and the internal surface 45 of the second tip part 38B, and enables smooth insertion of the second plate 25 into a space between the second engaging part 38 and the first plate 24.

Figure 7:
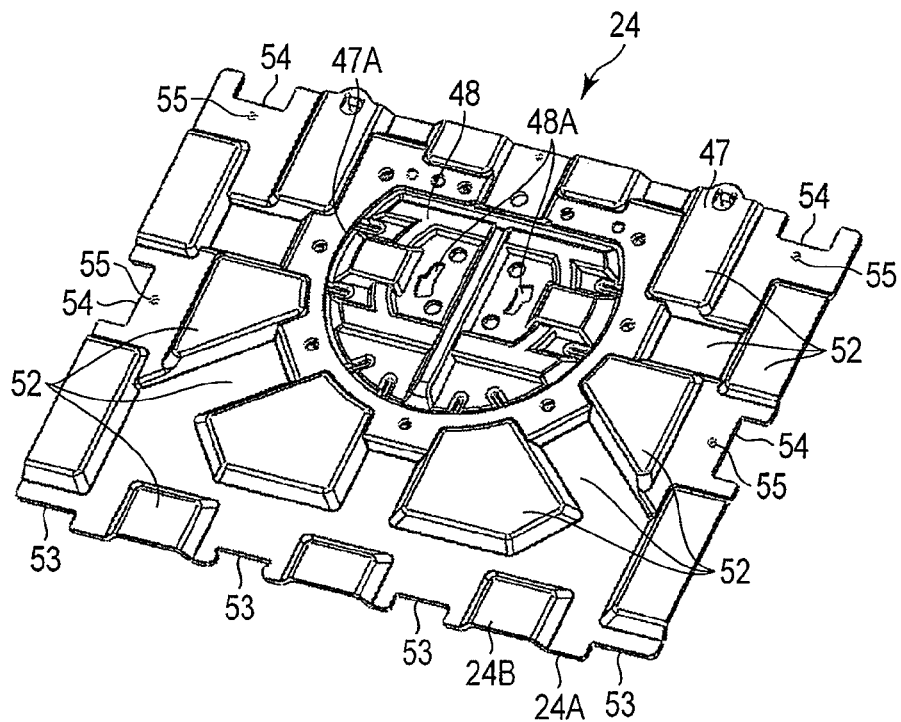
FIG. 7 is an exemplary perspective view of a first plate of the support module illustrated in FIG. 2, as viewed from below.

As illustrated in FIG. 7, the whole first plate 24 has an almost square shape. The first plate 24 includes a first surface 24A which faces the attaching surface 35 and disposed on the side closer to the display module 12, and a second surface 24B which is opposite to the first surface 24A. The first plate 24 includes a main plate 47 which has an almost semicircular opening 47A in an almost center part thereof and has an almost square shape, an almost semicircular subplate 48 which is attached to the main plate 47 to cover the opening 47A, and a plurality of fixing means 51 (see FIG. 3) configured to fix the subplate 48 onto the main plate 47. The fixing means 51 are formed of screws or the like, or may be other fixing means such as rivets or welding. The subplate 48 includes an engaging part 48A (hole) with which a hook 49 that extends from the swivel part 23 is engaged.

The main plate 47 includes a plurality of first drawn parts 52 (projecting parts and depressed parts) which are arranged in a plurality of positions for reinforcement, a plurality of first cutaway parts 53 which have an almost square shape and through which the first engaging parts 37 is inserted, a plurality of second cutaway parts 54 which have an almost square shape and through which the second engaging parts 38 is inserted, and first holes 55 which are arranged in the vicinity of the second cutaway parts 54. Female screws to fix the fixing members 26 are provided on the internal circumferential surfaces of the first holes 55. The main plate 47 (first plate 24) is formed of material such as iron with a thickness of, for example, about 2 mm.

As illustrated in FIG. 3 and FIG. 7, a depth (size in the depth direction) of each first cutaway part 53 is slightly (for example, from 0.1 mm to several millimeters) larger than a depth (size in the depth direction) of each first rising part 37A. Therefore, when the first plate 24 is attached to the attaching surface 35, the first tip part 37B of each first engaging part 37 can be superposed on the second surface 24B (upper side) of the first plate 24. A size in the width direction (size in the lateral direction) of each first cutaway part 53, which is perpendicular to the depth direction, is slightly (for example, from 0.1 mm to several millimeters) larger than a size in the width direction (size in the lateral direction) of each first rising part 37A.

As illustrated in FIG. 3 and FIG. 7, a depth of each second cutaway part 54 is larger than the depth of each first cutaway part 53. Specifically, the depth of each second cutaway part 54 is slightly (for example, from 0.1 mm to several millimeters) larger than the depth of the second tip part 38B of each second engaging part 38, to prevent the second engaging parts 38 from obstructing attachment of the first plate 24 to the attaching part 44 (the first plate 24 is not caught in the second engaging parts 38) (see FIG. 11). The size in the width direction (size in the lateral direction) of each second cutaway part 54, which is perpendicular to the depth direction, is slightly (for example, from 0.1 mm to several millimeters) larger than a size in the width direction (size in the lateral direction) of the second rising part 38A.

Figure 8:
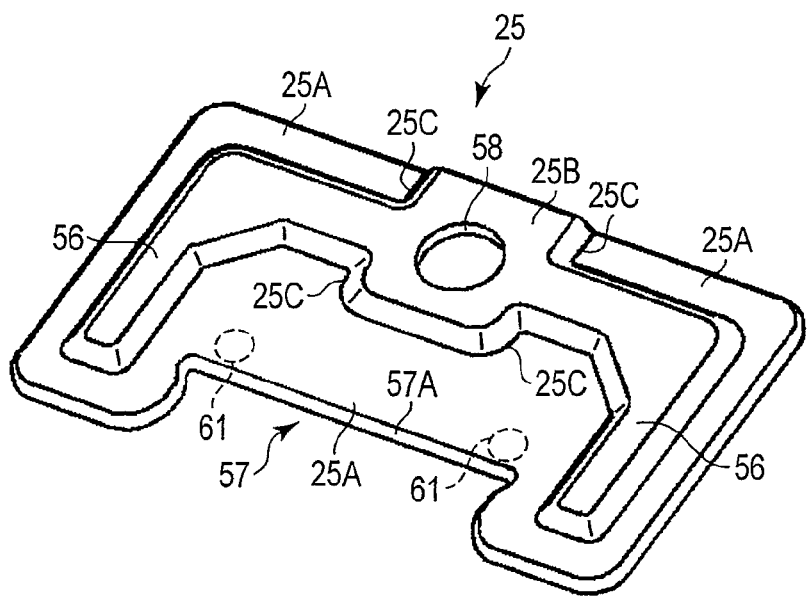
FIG. 8 is an exemplary perspective view of the second plate of the support module illustrated in FIG. 2, as viewed from below.

As illustrated in FIG. 8, each whole second plate 25 has an almost "C" shape. The second plates 25 are attached to the second surface 24B of the first plate 24, engaged with the second engaging parts 38, and thereby can attach the first plate 24 to the cover 22 (attaching surface 35). Each second plate 25 is formed of material such as iron with a thickness of, for example, about 0.8 mm.

Each second plate 25 includes a first part 25A which is formed in a flat plate shape to be in close contact with the first plate 24 and has an almost "C" shape, a second part 25B which is located with a space between the second part 25B and the first plate 24 and has a square shape, a boundary part 25C which is held between the first part 25A and the second part 25B, second drawn parts 56 (bead) which are provided on the first part 25A to reinforce the first part 25A, a square opening part 57 through which the second engaging part 38 (second rising part 38A) is inserted, an edge part 57A which defines the periphery of the opening part 57, a second hole 58 (through hole) which is formed in a circular shape in the second part 25B, and abutting parts 61 which are formed in the first part 25A and abut the second tip parts 38B of the second engaging parts 38 when the second plate 25 is changed to a second shape S2 described below.

As illustrated in FIG. 8 and FIG. 9, the second part 25B is located close to a side opposite to the opening part 57 in a part close to the center part of the second plate 25. A (part of) shaft part 26A of the fixing member 26 can be inserted through the inside of the second hole 58 (through hole), and there is a slight clearance between the shaft part 26A of the fixing member 26 and an internal surface of the second hole 58. The second drawn parts 56 are provided to connect with the center part of the first part 25A, and have a projection shape which continues in a "C" shape along the shape of the first part 25A. One end part of each second drawn part 56 is formed as one unitary piece with the second part 25B. Each second drawn part 56 is disposed in a position out of the second part 25B, and thereby the second part 25B is prevented from having too high stiffness. Therefore, the second plate 25 has moderate stiffness around the second part 25B, and can have flexibility (elasticity) in a thickness direction (shearing direction).

In the present embodiment, the second plate 25 can be changed between a first shape S1 in which the first part 25A is in close contact with the first plate 24, and a second shape S2 in which the second part 25B is bent by the fixing member 26 (screw) to approach the first plate 24 and thereby the first part 25A is rotated around the boundary part 25C and engaged with the second tip part 38B. The second drawn parts 56 not only increase stiffness of parts of the second plate 25 other than the second part 25B, but also prevent the second plate 25 from being attached to a part between the internal surface of the second engaging part 38 and the second surface 24B of the first plate 24 when the second plate is reversed.

Next, a process of assembling the support module of the present embodiment will be explained hereinafter with reference to FIG. 4, FIG. 9, FIG. 10, and FIG. 11. As illustrated in FIG. 11, the cover 22 with the bottom surface 31 up is placed on a working table or the like. The first plate 24 is slantly inserted into the attaching part 44 for the cover 22 from above. In this operation, the first plate 24 is attached to the attaching part 44, such that the first rising parts 37A of the first engaging parts 37 are located inside the first cutaway parts 53 and part of the first plate 24 is held between the first tip parts 37B of the first engaging parts 37 and the attaching surface 35 (second ribs 42). In this state, the second engaging parts 38 are inserted through the inside of the second cutaway parts 54 of the first plate 24. (Although only the main plate 47 of the first plate 24 is attached in FIG. 11, an assembly obtained by assembling the main plate 47, the subplate 48, and the swivel part 23 together in advance can be attached to the attaching part 44.)

As illustrated in FIG. 4 and FIG. 9, second plates 25 are attached to the first plate 24 from the side of the second surface 24B of the first plate 24 to run along the first plate 24. Each second plate 25 is inserted between the second tip part 38B and the first plate 24, to fill a space between the second tip part 38B of the second engaging part 38 and the first plate 24 (second surface 24B). In a state where each second plate 25 is fitted into the space between the second tip part 38B and the first plate 24, the second rising part 38A of the second engaging part 38 is located inside the opening part 57 of the second plate 25. In addition, the fixing members 26 (screws) are inserted through the second holes 58 of the second plates 25, and the fixing members 26 (screws) are tightened (driven) into the first holes 55 of the first plate 24.

Figure 10:
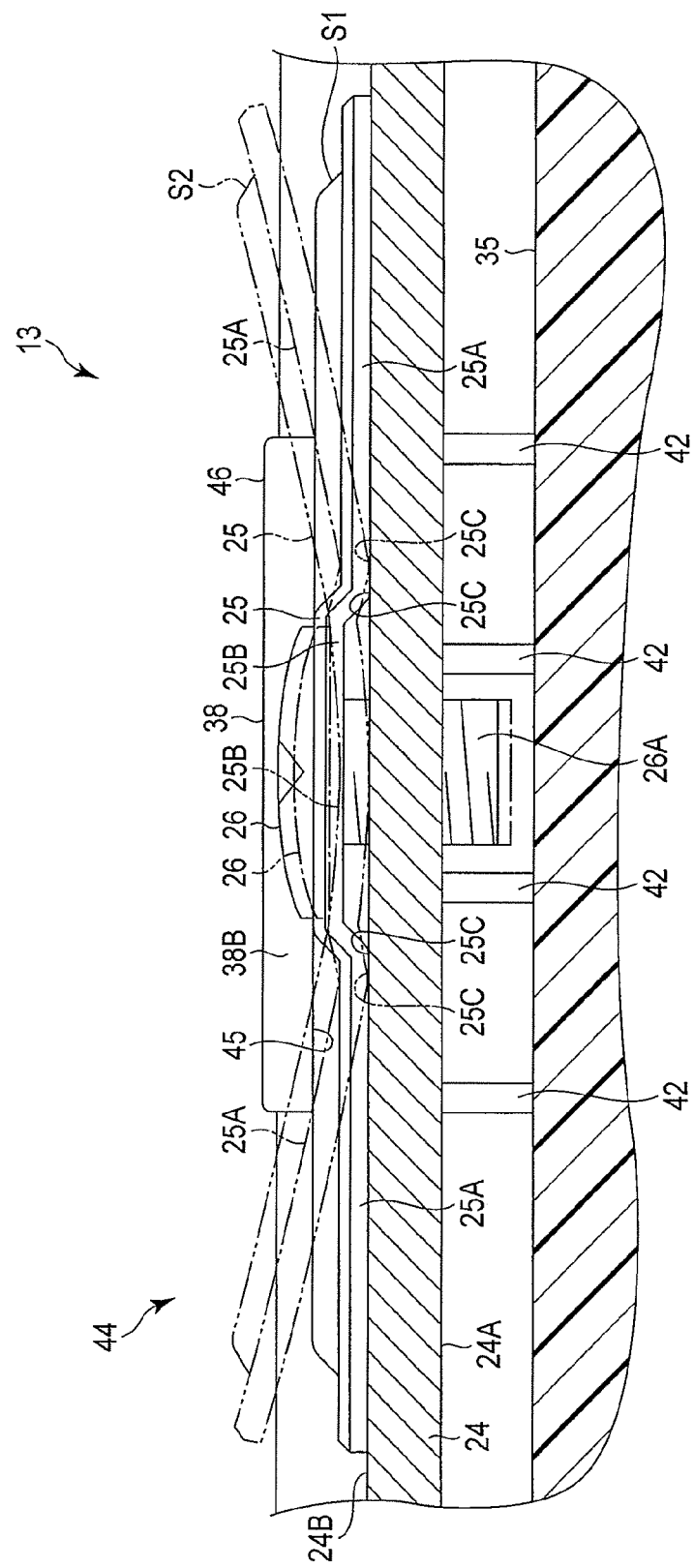
FIG. 10 is an exemplary cross-sectional view taken along line F10-F10 of FIG. 3.

As illustrated in FIG. 10, in a state where the fixing members 26 (screws) are lightly driven in the first holes 55 or the fixing members 26 (screws) are not tightened, each second plate 25 has a first shape S1 in which the first part 25A is in close contact with the first plate 24, as illustrated by solid lines. The fixing members 26 are brought close to the first plate 24 (screws are tightened), and thereby each second plate 25 can be bent in the second part 25B. Thereby, as illustrated by broken lines in FIG. 10, the first part 25A is rotated around the boundary part 25C in a direction of going away from the first plate 24, and the first part 25A abuts against the internal surface 45 of the second tip part 38B of the second engaging part 38. In this state, the second plate 25 has the second shape S2 in which the first part 25A is curved in a direction of going away from the first plate 24, and can change to the state (engaged state) of being engaged with the second engaging part 38. During this operation, the force of pushing the first part 25A against the second tip part 38B can be controlled as desired, by controlling the distance between the fixing members 26 (screw tightening quantity) and the first plate 24, and changing the bending quantity of the second parts 25B.

In addition, the band 27 and the string-hole rings 28 are fixed onto the first plate 24, a buffer material sheet 29 which is an elastic member made of rubber or the like is adhered to a predetermined position of the first plate 24, and thereby assembly of the support module 13 is finished.

According to the first embodiment, the display apparatus 11 comprises a module, the first plate 24 which includes the first surface 24A that faces the module and the second surface 24B located opposite to the first surface 24A and supports the module, the cover 22 which includes the attaching surface 35 that is attached to the first plate 24 and opposed to the first surface 24A, and the engaging parts that include tip parts extending in parallel with the first plate 24 on the side of the second plate 24B, the second plates 25 which are attached to the first plate 24 from the side of the second surface 24B to run along the first plate 24 and fill the space between the second surface 24B and the tip part, and engaged with the engaging parts to fix the cover 22 onto the first plate 24, and fixing members which fix the second plates to the first plate.

According to the above structure, since the embodiment has the structure of attaching the cover 22 to the first plate 24 to run along the first plate 24 by using the second plates 25, it is possible to prevent increase in the size in the height direction (thickness direction), and reduce the thickness of the structure formed of the first plate 24, the second plates 25, and the cover 22.

In the display apparatus 11, each second plate 25 includes the first part 25A which is in close contact with the first plate 24, the second part 25B which is located with a space between the second part 25B and the first plate 24, the boundary part 25C which is held between the first plate 25A and the second part 25B, and each second plate 25 can be changed between the first shape S1 in which the first part 25A is in close contact with the first plate 24, and the second shape S2 in which the second part 25B is bent to approach the first plate 24 by the fixing member 26 and thereby the first part 25A is rotated around the boundary part 25C and engaged with the tip part.

According to the above structure, the second plates 25 and the first plate 24 are fixed by the fixing members 26, and the first plate 24 and the cover 22 are not fixed by the fixing members 26. Therefore, it is unnecessary to use a structure such as bosses for fixing the fixing members 26 onto the cover 22, and thereby the cover 22 is thinned and thickness of the structure can be reduced. In addition, since no members such as bosses are necessary, no sink marks are formed in the external surface when formation of the cover 22 is finished, and the appearance of the cover 22 is not deteriorated.

Each second part 25B is provided with a through hole through which part of the fixing member 26 is inserted. According to this structure, the second plate 25 is easily bent (stress concentration easily occurs) around the through hole of the second part 25B, and thereby the second part 25B can be easily bent in the thickness direction (shearing direction) and the rotation of the first part 25A can be easily caused.

The second plate 25 is provided with the second drawn parts 56 in positions out of the second part 25B. According to this structure, it is possible to prevent increase in stiffness in the second part 25B, and prevent the second part 25B from being hard to bend. Besides, it is possible to increase stiffness of parts of the second plate 25 other than the second part 25B.

The fixing members 26 are screws. According to this structure, it is possible to easily control the bending quantity of the second part 25B.

Next, a second embodiment of the display apparatus will be explained hereinafter with reference to FIG. 12. A display apparatus 11 (television) which is an example of an electronic apparatus according to a second embodiment is different from the apparatus of the first embodiment in structure of second plates 25, but is the same as the first embodiment in other parts. Therefore, parts of the second embodiment which are different from the first embodiment will be mainly explained hereinafter, and constituent elements which are the same as those of the first embodiment will be denoted by the same respective reference numerals as those of the first embodiment and explanation thereof is omitted.

Each second plate 25 according to the second embodiment has an almost "C" shape as a whole. The second plates 25 are attached to a second surface 24B of a first plate 24 and engaged with second engaging parts 38, and thereby can attach the first plate 24 to a cover 22 (attaching surface).

Each second plate 25 includes a first part 25A which is a flat, substantially "C"-shaped plate and can be brought into close contact with the first plate 24, a second part 25B which is positioned with a space between the second part 25B and the first plate 24 and has a square shape, a boundary part 25C which is held between the first part 25A and the second part 25B, third parts 25D which have flexibility such that the third parts 25D are movable in a thickness direction of the second plate 25, second drawn parts 56 (beads) which are provided in the first part 25A to reinforce the first plate 25A, a square opening part 57 through which the second engaging part 38 is inserted, and a second hole 58 (through hole) which is formed in the second part 25B and has a circular shape.

The second part 25B is disposed close to a side opposite to the opening part 57, in a part close to the center of the second plate 25. A shaft part 26A of a fixing member 26 can be inserted through the inside of the second hole 58, and there is a slight clearance between the shaft part 26A of the fixing member 26 and an internal surface of the second hole 58. The second drawn parts 56 are provided to connect with the center part of the first part 25A, and have a projection shape which connects with the first part 25A in a "C" shape along the shape of the first part 25A. One end part of each second drawn part 56 is formed as one unitary piece with the second part 25B.

The third parts 25D are disposed with a space between the third parts 25D and the first plate 24, and have flexibility (elasticity) which can be slightly (about 0.1 mm to 1 mm) moved in the thickness direction of the second plate 25. The third parts 25D extends in a straight-line manner from an edge part 57A, which defines the periphery of the opening part 57, in a direction which is, for example, perpendicular to the edge part 57A. Each third part 25D projects from the first part 25A which is located around the third part 25D and has a peak-shaped cross section, the cross section shape of the third parts 25D is not limited to it. Each third part 25D may have any cross section shape (semicircular cross section, arch cross section, and valley-shaped cross section), as long as the third part can exhibit flexibility (elasticity) such that the third part can move in the thickness direction of the second plate 25.

Next, a process of assembling a support module 13 of the present embodiment will be explained hereinafter with reference to FIG. 4, FIG. 11, and FIG. 12. In the same manner as the first embodiment illustrated in FIG. 11, the cover 22 with a bottom surface up is placed on a working table or the like. The first plate 24 is slantly inserted into an attaching part 44 from above for the cover 22. During this operation, the first plate 24 is attached to the attaching part 44, such that first rising parts 37A of first engaging parts 37 are located inside respective first cutaway parts 53, and part of the first plate 24 is held between first tip parts 37B of the first engaging parts 37 and the attaching surface 35. During this operation, the second engaging parts 38 are inserted through second cutaway parts 54 of the first plate 24.

Like the first embodiment illustrated in FIG. 4, the second plates 25 are attached to the second surface 24B of the first plate 24. Each second plate 25 is inserted to fill a space between a second tip part 38B of the second engaging part 38 and the first plate 24. During this operation, the third part 25D of each second plate 25 can exhibit flexibility in the thickness direction of the second plate 25, and thus the third part 25D is press-fitted into the space between the second tip part 38B (internal surface) and the first plate 24 (second surface 24B) reasonably when the second plate 25 is inserted. In addition, since the third part 25D is guided by an inclined surface 45A provided on part of an internal surface 45 of the second tip part 38B (see FIG. 9), the third part 25D is not caught by an end part of the second tip part 38B, and the second plate 25 is smoothly inserted.

In the state where each second plate 25 is fitted into the space between the second tip part 38B and the first plate 24, the second rising part 38A of the second engaging part 38 is located inside the opening part 57 of the second plate 25. In this state, a fixing member 26 (screw) is inserted through the second hole 58 of the second plate 25, and fixed into a first hole 55 of the first plate 24. In addition, a band 27 and string-hole rings 28 are fixed onto the first plate 24, a buffer material sheet 29 which is formed of elastic material such as rubber is adhered to a predetermined part of the first plate 24, and thereby assembly of the support module 13 is finished.

According to the second embodiment, each second plate 25 includes the first part 25A which is in close contact with the first plate 24, and the third parts 25D which are located with a space between the third parts 25D and the first plate 24, have flexibility enough to be movable in the thickness direction of the second plate 25, and press-fitted into the spaces between the second surface 24B and the respective tip parts. According to this structure, a structure in which the cover 22 is not fixed onto the first plate 24 directly is obtained, and thus the thickness of the cover 22 can be reduced, since it is unnecessary to provide the cover 22 with a structure such as bosses to fix the fixing members 26. Thereby, it is possible to reduce the thickness of the structure formed of the first plate 24, the second plates 25, and the cover 22.

The electronic apparatus is not limited to the above embodiments, but may be carried out by modifying the constituent elements within a range not departing from the gist. Specifically, although the display module 12 is disclosed as an example of the module in the above embodiments, examples of the module are not limited to it. The module may be, for example, a mobile phone, a portable information terminal, a portable computer, a car navigation system, a portable music player, a portable radio, an electronic book reader, a portable game machine, a wireless communication device, a radar device, various authentication devices, a video camera, a security camera, a digital camera, or a sound device such as a speaker, or other units and devices which have specific functions. In addition, various inventions can be formed by proper combinations of constituent elements disclosed in the above embodiments. For example, some constituent elements may be deleted from all the constituent elements disclosed in the embodiment. Besides, constituent elements of different embodiments may be used in combination.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
a module;
a first plate which has a first surface that faces the module, and a second surface that is opposite to the first surface, the first plate supporting the module;
a cover which includes an attaching surface that is attached to the first plate and opposed to the first surface, and an engaging part that projects from the attaching surface and includes a tip part that extends in parallel with the first plate on a side of the second surface;
a second plate which is attached to the first plate from a side of the second surface of the first plate to run along the first plate between the second surface of the first plate and the tip part; and
a fixing member which fixes the second plate onto the first plate
wherein the first plate includes a cutaway part through which the engaging part is inserted into the first plate, and the second plate covers the cutaway part between the first plate and the tip part, and the second plate is, when fixed onto the first plate by the fixing member, engaged with the engaging part to fix the cover onto the first plate.

2. The electronic apparatus of claim 1, wherein
the second plate includes a first part which is in close contact with the first plate, a second part which is located within a space between the first plate and the second part, and a boundary part which is held between the first part and the second part, and the second plate can be changed between a first shape in which the first part is in close contact with the first plate, and a second shape in which the second part is bent by the fixing member to approach the first plate and thereby the first part is rotated around the boundary part and engaged with the tip part.

3. The electronic apparatus of claim 2, wherein
the second part is provided with a through hole, through which part of the fixing member is inserted.

4. The electronic apparatus of claim 3, wherein
the second plate is provided with a drawn part in a position out of the second part.

5. The electronic apparatus of claim 4, wherein
the fixing member is a screw.

6. The electronic apparatus of claim 1, wherein
the second plate includes a first part which is in close contact with the first plate, and a third part which is located within a space between the first plate and the third part, the third part having flexibility enough to be movable in a thickness direction of the second plate and being press-fitted into a space between the second surface and the tip part.

7. A support device comprising:
a first plate which includes a first surface and a second surface that is opposite to the first surface;
a cover which includes an attaching surface that is attached to the first plate and opposed to the first surface, and an engaging part that projects from the attaching surface includes a tip part that extends in parallel with the first plate on a side of the second surface;
a second plate which is attached to the first plate from a side of the second surface of the first plate to run along the first plate between the second surface of the first plate and the tip part; and
a fixing member which fixes the second plate onto the first plate,
wherein the first plate includes a cutaway part through which the engaging part is inserted into the first plate, and the second plate covers the cutaway part between the first plate and the tip part, and the second plate is, when fixed onto the first plate by the fixing member, engaged with the engaging part to fix the cover onto the first plate.

8. The support device of claim 7, wherein the fixing member, when fixing the second plate onto the first plate, bends the second plate to engage the second plate with the tip part of the engaging part.

9. The support device of claim 7, further comprising a plurality of ribs which project from the attaching surface and contact the first surface of the first plate in a position corresponding to the cutaway part.

* * * * *